(12) United States Patent
Park

(10) Patent No.: US 12,236,107 B2
(45) Date of Patent: Feb. 25, 2025

(54) MEMORY DEVICE AND METHOD OF OPERATING THE MEMORY DEVICE

(71) Applicant: SK hynix Inc., Icheon-si (KR)

(72) Inventor: Tae Hun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 185 days.

(21) Appl. No.: 17/991,212

(22) Filed: Nov. 21, 2022

(65) Prior Publication Data

US 2024/0028217 A1  Jan. 25, 2024

(30) Foreign Application Priority Data

Jul. 21, 2022 (KR) .................. 10-2022-0090098

(51) Int. Cl.
*G06F 3/06* (2006.01)
*G11C 16/34* (2006.01)

(52) U.S. Cl.
CPC .......... *G06F 3/0619* (2013.01); *G06F 3/0629* (2013.01); *G06F 3/0679* (2013.01); *G11C 16/3404* (2013.01)

(58) Field of Classification Search
CPC .... G06F 3/0619; G06F 3/0629; G06F 3/0679; G11C 16/3404; G11C 7/14; G11C 11/5628; G11C 16/08; G11C 16/10; G11C 16/3427; G11C 16/0483; G11C 16/16; G11C 16/30; G11C 16/34; G11C 8/14
USPC .................................................... 365/210.12
See application file for complete search history.

(56) References Cited

U.S. PATENT DOCUMENTS

| | | | |
|---|---|---|---|
| 9,607,711 | B1 * | 3/2017 | Lee |
| 2015/0036429 | A1 * | 2/2015 | Kim |
| 2017/0287561 | A1 * | 10/2017 | Lee |
| 2020/0202936 | A1 * | 6/2020 | Lee |
| 2023/0207027 | A1 * | 6/2023 | Song |

FOREIGN PATENT DOCUMENTS

| | | |
|---|---|---|
| KR | 1020100107176 A | 10/2010 |
| KR | 1020110002243 A | 1/2011 |
| KR | 1020190076483 A | 7/2019 |

* cited by examiner

*Primary Examiner* — Fernando Hidalgo
(74) *Attorney, Agent, or Firm* — William Park & Associates Ltd.

(57) ABSTRACT

The present technology relates to an electronic device. A memory device according to an embodiment includes a memory cell string including first memory cells included in a first channel area, second memory cells included in a second channel area, and dummy memory cells connected between the first memory cells and the second memory cells, a peripheral circuit configured to perform a program operation of storing data in the first and second memory cells, and a program operation controller configured to control the peripheral circuit to apply a first pass voltage to a dummy word line connected to the dummy memory cells during the program operation, apply a second pass voltage less than the first pass voltage to the dummy word line, and then apply a program voltage to a selected word line among a plurality of word lines connected to the first and second memory cells.

20 Claims, 13 Drawing Sheets

FIG. 11
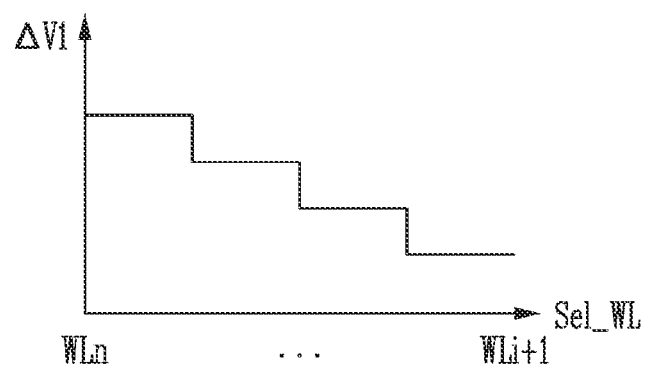
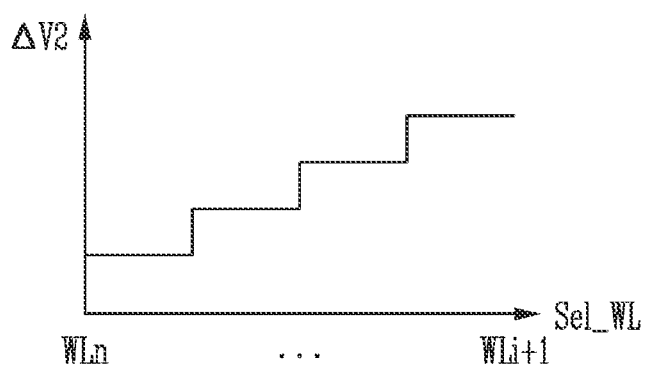

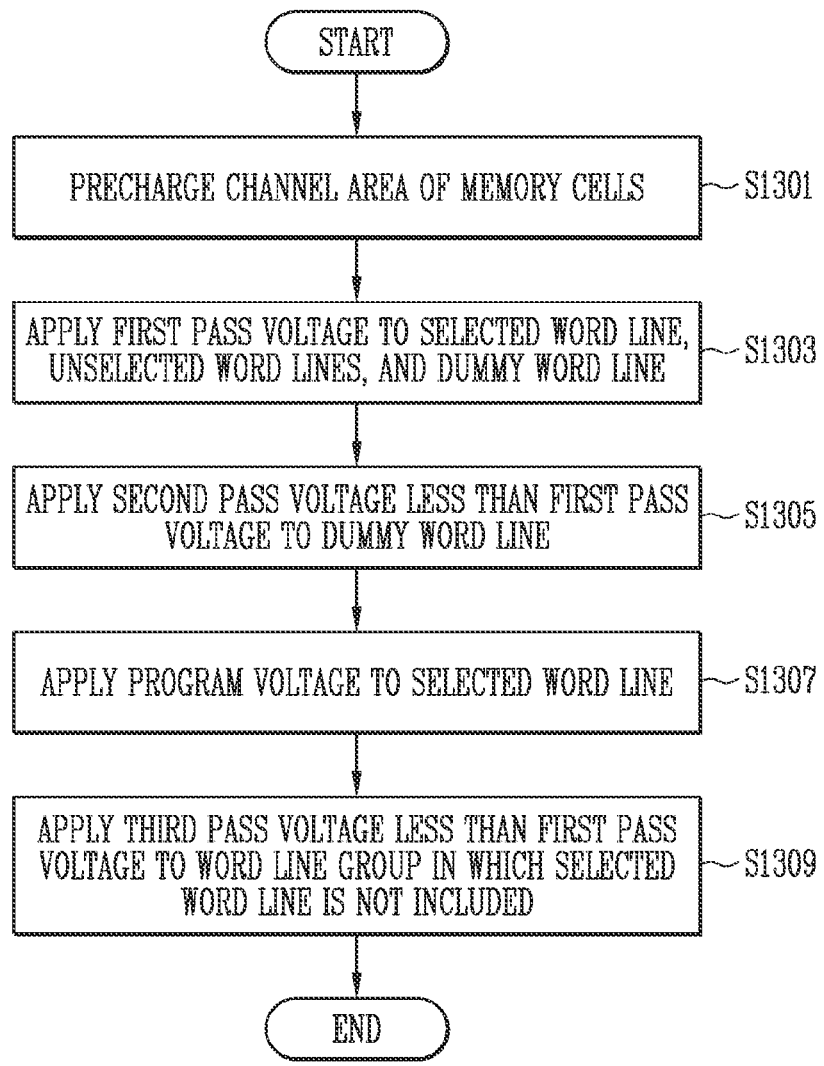

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2022-0090098, filed on Jul. 21, 2022, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A memory system is a device that stores data under control of a host device such as a computer or a smartphone. The memory system may include a memory device in which data is stored and a memory controller controlling the memory device. The memory device is classified into a volatile memory device and a nonvolatile memory device.

The nonvolatile memory device is a device in which data is not lost even though power is cut off, and the nonvolatile memory device includes a read only memory (ROM), a programmable ROM (PROM), an electrically programmable ROM (EPROM), an electrically erasable and programmable ROM (EEPROM), a flash memory, and the like.

A program operation is an operation of storing data in memory cells included in the nonvolatile memory device. In the program operation, a program voltage is applied to selected memory cells to increase a threshold voltage, and a pass voltage is applied to unselected memory cells to prevent the threshold voltage from being increased. However, since the pass voltage is also applied to the unselected memory cells, the threshold voltage of the unselected memory cells of which the threshold voltage is not required to be increased may increase due to the pass voltage. Accordingly, a magnitude of the pass voltage is adjusted so as not to increase the threshold voltage of the unselected memory cells during the program operation.

SUMMARY

According to an embodiment of the present disclosure, a memory device may include a memory cell string including first memory cells included in a first channel area formed vertically on a substrate, second memory cells included in a second channel area positioned on the first channel area, and dummy memory cells included in the second channel area and connected between the first memory cells and the second memory cells, a peripheral circuit configured to perform a program operation of storing data in the first and second memory cells, and a program operation controller configured to control the peripheral circuit to apply a first pass voltage to a dummy word line connected to the dummy memory cells during the program operation, apply a second pass voltage less than the first pass voltage to the dummy word line, and then apply a program voltage to a selected word line among a plurality of word lines connected to the first and second memory cells.

According to an embodiment of the present disclosure, a method of operating a memory device including first memory cells included in a first channel area formed vertically on a substrate, second memory cells included in a second channel area positioned on the first channel area, and dummy memory cells included in the second channel area and connected between the first memory cells and the second memory cells includes applying a first pass voltage to a dummy word line connected to the dummy memory cells and applying a second pass voltage less than the first pass voltage to the dummy word line, and applying a program voltage to a selected word line among a plurality of word lines connected to the first and second memory cells.

BRIEF DESCRIPTION OF THE DRAWINGS

FIG. 11 is a diagram illustrating an example of a magnitude of a pass voltage changed according to a position of a selected word line.

FIG. 13 is a flowchart illustrating a program operation of a memory device according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

An embodiment of the present disclosure provides a memory device and a method of operating the memory device capable of improving a threshold voltage distribution of memory cells during a program operation.

According to an embodiment, a memory device and a method of operating the memory device capable of improving a threshold voltage distribution of memory cells during a program operation are provided.

Figure 1:
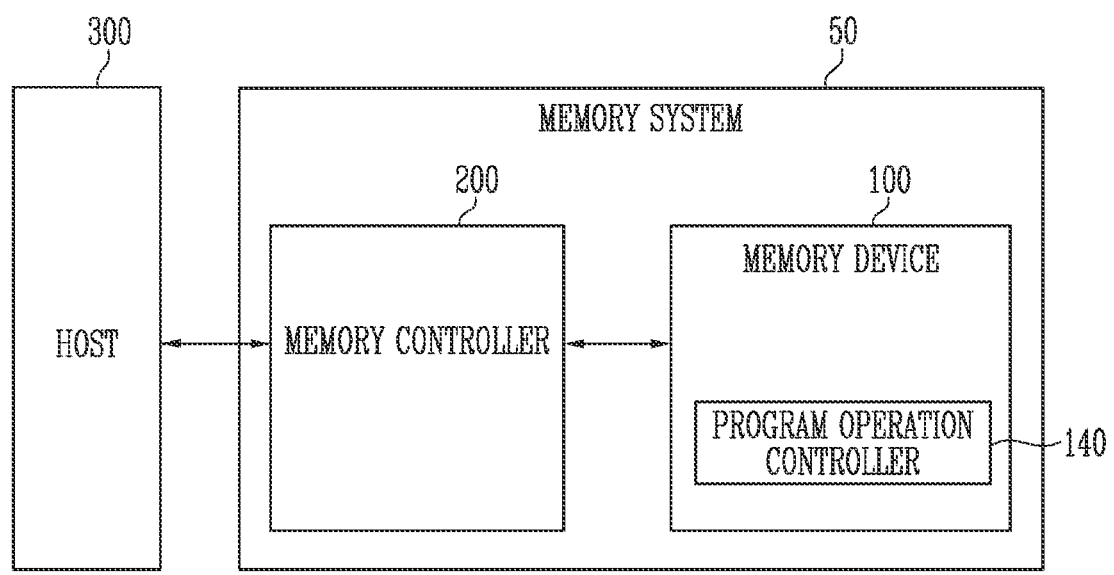
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, the memory system 50 may include a memory device 100 and a memory controller 200. The memory system 50 may be a device that stores data under control of a host 300 such as a cellular phone, a smartphone, an MP3 player, a laptop computer, a desktop computer, a game player, a TV, a tablet PC, or an in-vehicle infotainment system.

The memory system 50 may be manufactured as one of various types of storage devices according to a host interface that is a communication method with the host 300. For example, the memory system 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The memory system 50 may be manufactured as any one of various types of packages. For example, the memory system 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address in the memory cell array. The memory device 100 may perform an operation instructed by the command on the area selected by the address. For example, the memory device 100 may perform a write operation (program operation), a read operation, and an erase operation. The memory device 100 may program, read, or erase data in the area selected by the address.

In an embodiment, the memory device 100 may include a program operation controller 140.

The program operation controller 140 may control a program operation on the memory cells. The program operation may be an operation of storing data in the memory cells. Specifically, the program operation may be an operation of increasing a threshold voltage of the memory cells according to data to be stored in the memory cells. When the program operation is performed, the memory cells may have a threshold voltage corresponding to any one of a plurality of program states. The plurality of program states may be determined according to the number of data bits stored in one memory cell. For example, when one memory cell is programmed in a triple level cell (TLC) that stores three bits of data, the plurality of program states may mean an erase state and first to seventh program states. The threshold voltage of the memory cells after the program operation is performed may be determined according to data to be stored in the memory cells. Each of the memory cells may have any one of the plurality of program states as a target program state according to data to be stored.

In an embodiment, the program operation may include a plurality of program loops. Each program loop may include a program voltage apply operation and a verify operation. The program voltage apply operation may be an operation of increasing the threshold voltage of the memory cells using a program voltage. The program voltage apply operation may include a precharge operation. The precharge operation may be an operation of increasing a channel potential of the plurality of memory cells. The verify operation may be an operation of identifying whether the threshold voltage of the memory cells reaches the threshold voltage corresponding to the target program state using a verify voltage.

In an embodiment, the program operation controller 140 may control voltages to be applied to each word line to which the memory cells are connected during the program operation.

The memory controller 200 may control an overall operation of the memory system 50.

When power is applied to the memory system 50, the memory controller 200 may execute firmware (FW). In an embodiment, the memory controller 200 may execute firmware to control communication between the host 300 and the memory device 100. In an embodiment, the memory controller 200 may convert a logical block address of the host into a physical block address of the memory device.

The memory controller 200 may control the memory device 100 to perform the write operation, the read operation, the erase operation, or the like according to a request of the host 300. The memory controller 200 may provide a command, a physical block address, or data to the memory device 100 according to the write operation, the read operation, or the erase operation.

In an embodiment, the memory controller 200 may generate a command, an address, and data independently regardless of the request from the host 300 and transmit the command, the address, and the data to the memory device 100. For example, the memory controller 200 may provide the command, the address, and the data for performing the read operation and the write operations accompanying in performing wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

The host 300 may communicate with the memory system 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
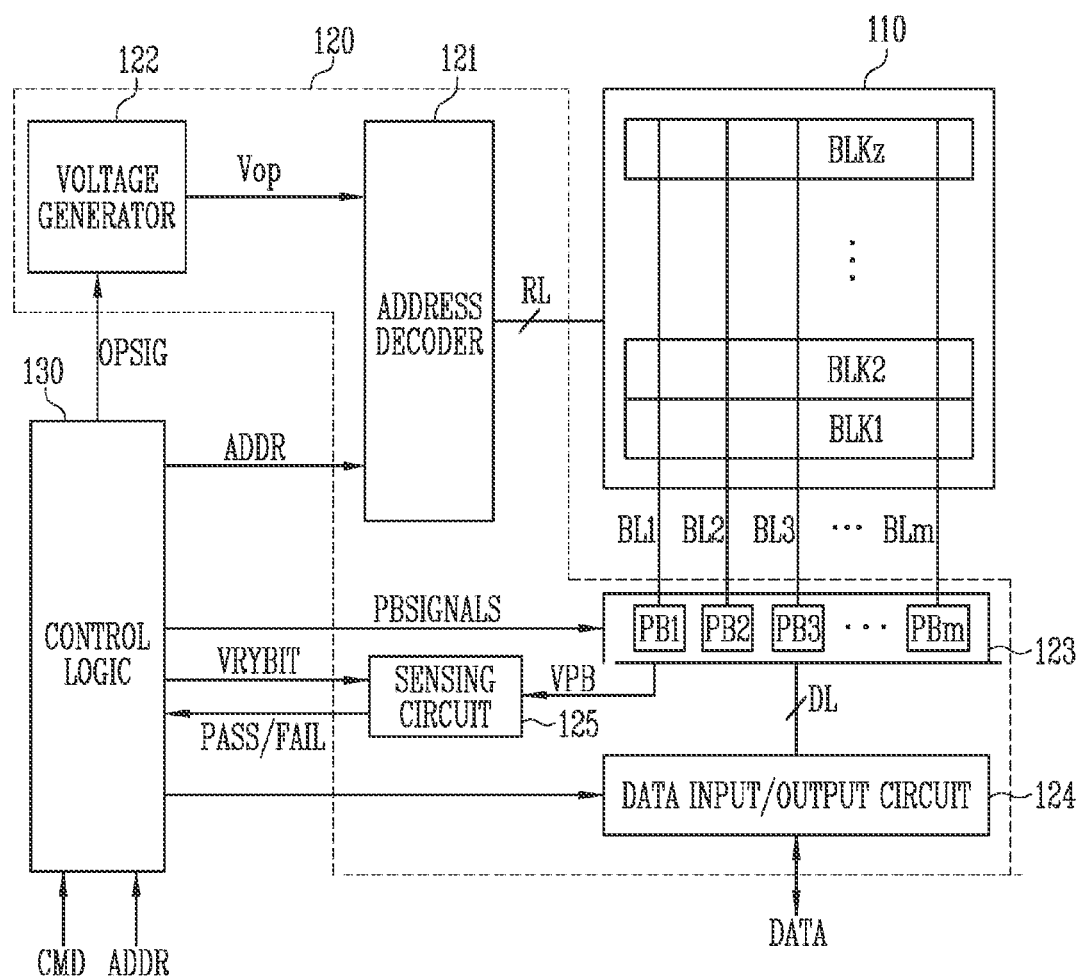
FIG. 2 is a diagram illustrating a structure of the memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a page buffer group 123 through bit lines BL1 to BLm. Each of the plurality of memory blocks BLK1 to BLKz may include a plurality of memory cells. As an embodiment, the plurality of memory cells may be nonvolatile memory cells. Memory cells connected to the same word line among the plurality of memory cells may be defined as one page. That is, the memory cell array 110 may be configured of a plurality of pages. In an embodiment, the page may be a unit for storing data or reading stored data. The memory block may be a unit for erasing data. In an embodiment, each of the plurality of memory blocks BLK1 to BLKz included in the memory cell array 110 may include a plurality of dummy memory cells. At least one of the dummy memory cells may be connected in series between a drain select transistor and the memory cells and between a source select transistor and the memory cells.

Each of the memory cells of the memory device 100 may be configured as a single level cell (SLC) that stores one bit of data, a multi-level cell (MLC) that stores two bits of data, a triple level cell (TLC) that stores three bits of data, or a quad level cell (QLC) capable of storing four bits of data.

The peripheral circuit 120 may drive the memory cell array 110. For example, the peripheral circuit 120 may drive the memory cell array 110 to perform the program operation, the read operation, and the erase operation under control of the control logic 130. As another example, the peripheral circuit 120 may apply various operation voltages to the row lines RL and the bit lines BL1 to BLm or discharge the applied voltages according to the control of the control logic 130.

The peripheral circuit 120 may include the address decoder 121, a voltage generator 122, the page buffer group 123, a data input/output circuit 124, and a sensing circuit 125.

The address decoder 121 may be connected to the memory cell array 110 through the row lines RL. The row lines RL may include drain select lines, word lines, source select lines, and a source line. In an embodiment, the word lines may include normal word lines and dummy word lines. In an embodiment, the row lines RL may further include a pipe select line.

The address decoder 121 may be configured to operate in response to the control of the control logic 130. The address decoder 121 may receive an address ADDR from the control logic 130.

The address decoder 121 may be configured to decode a block address of the received address ADDR. The address decoder 121 may select at least one memory block among the memory blocks BLK1 to BLKz according to the decoded block address. The address decoder 121 may be configured to decode a row address of the received address ADDR. The address decoder 121 may select at least one word line of the selected memory block by applying voltages provided from the voltage generator 122 to at least one word line WL according to the decoded row address.

During the program operation, the address decoder 121 may apply the program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

The erase operation of the memory device 100 may be performed in a memory block unit. The address ADDR input to the memory device 100 during the erase operation may include a block address. The address decoder 121 may decode the block address and select one memory block according to the decoded block address. During the erase operation, the address decoder 121 may apply a ground voltage to the word lines connected to the selected memory block.

The address decoder 121 may be configured to decode a column address of the transferred address ADDR. The decoded column address may be transferred to the page buffer group 123. As an example, the address decoder 121 may include a component such as a row decoder, a column decoder, and an address buffer.

The voltage generator 122 may be configured to generate a plurality of operation voltages Vop by using an external power voltage supplied to the memory device 100. The voltage generator 122 may operate in response to the control of the control logic 130.

As an example, the voltage generator 122 may generate an internal power voltage by regulating the external power voltage. The internal power voltage generated by the voltage generator 122 is used as an operation voltage of the memory device 100.

As an embodiment, the voltage generator 122 may generate the various operation voltages Vop used for the program, read, and erase operations in response to an operation signal OPSIG. The voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors in response to the control logic 130 to generate the plurality of operation voltages Vop.

The plurality of generated operation voltages Vop may be supplied to the memory cell array 110 by the address decoder 121.

The page buffer group 123 may include first to m-th page buffers PB1 to PBm. The first to m-th page buffers PB1 to PBm may be connected to the memory cell array 110 through first to m-th bit lines BL1 to BLm, respectively. The first to m-th page buffers PB1 to PBm may operate in response to the control of the control logic 130.

The first to m-th page buffers PB1 to PBm may communicate data DATA with the data input/output circuit 124. At a time of program, the first to m-th page buffers PB1 to PBm may receive the data DATA to be stored through the data input/output circuit 124 and data lines DL.

During the program operation, when a program pulse is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page may be programmed according to the transferred data DATA. A memory cell connected to a bit line to which a program allowable voltage (for example, a ground voltage) is applied may have an increased threshold voltage. A threshold voltage of a memory cell connected to a bit line to which a program inhibit voltage (for example, a power voltage) is applied may be maintained. During the program verify operation, the first to m-th page buffers PB1 to PBm may read the data DATA stored in the memory cells from the selected memory cells through the bit lines BL1 to BLm.

During the read operation, the page buffer group 123 may read the data DATA from the memory cells of the selected page through the bit lines BL and store the read data DATA in the first to m-th page buffers PB1 to PBm.

During the erase operation, the page buffer group 123 may float the bit lines BL. As an embodiment, the page buffer group 123 may include a column selection circuit.

In an embodiment, while data stored in some of the page buffers among the plurality of page buffers included in the page buffer group 123 is programmed in the memory cell array 110, other page buffers may receive new data from the memory controller 200 and store the new data.

The data input/output circuit 124 may be connected to the first to m-th page buffers PB1 to PBm through the data lines DL. The data input/output circuit 124 may operate in response to the control of the control logic 130.

The data input/output circuit 124 may include a plurality of input/output buffers (not shown) that receive input data DATA. During the program operation, the data input/output circuit 124 may receive the data DATA to be stored from an external controller (not shown). During the read operation, the data input/output circuit 124 may output the data DATA transferred from the first to m-th page buffers PB1 to PBm included in the page buffer group 123 to the external controller.

During the read operation or the verify operation, the sensing circuit 125 may generate a reference current in response to a signal of an allowable bit VRYBIT generated by the control logic 130 and may compare a sensing voltage VPB received from the page buffer group 123 with a reference voltage generated by the reference current to output a pass signal or a fail signal to the control logic 130. For example, the sensing circuit 125 may output the pass signal to the control logic 130 when a magnitude of the sensing voltage VPB is greater than the reference voltage. As another example, the sensing circuit 125 may output the fail signal to the control logic 130 when the magnitude of the sensing voltage VPB is less than the reference voltage.

The control logic 130 may be connected to the address decoder 121, the voltage generator 122, the page buffer group 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate the operation signal OPSIG, the address ADDR, a page buffer control signal PBSIGNALS, and the allowable bit VRYBIT in response to the command CMD and the address ADDR. The control logic 130 may output the operation signal OPSIG to the voltage generator 122, output the address ADDR to the address decoder 121, output the page buffer control signal PBSIGNALS to the page buffer group 123, and output the allowable bit VRYBIT to the sensing circuit 125. In addition, the control logic 130 may determine whether the verify operation is passed or failed in response to the pass or fail signal PASS/FAIL output by the sensing circuit 125.

In an embodiment, the control logic 130 may include the program operation controller 140 shown in FIG. 1. The program operation controller 140 may control the peripheral circuit 120 to apply program related voltages to a plurality of word lines during the program operation. The program related voltages may include the program voltage and the plurality of pass voltages. The program voltage may be a voltage applied to the selected word line during the program operation. The plurality of pass voltages may be voltages applied to the unselected word lines during the program operation. Each of the plurality of pass voltages may be voltages having different magnitudes. The plurality of pass voltages may be less than the program voltage. In an embodiment, the program operation controller 140 may control the peripheral circuit 120 to apply pass voltages of different magnitudes according to positions of the plurality of word lines during the program operation.

Figure 3:
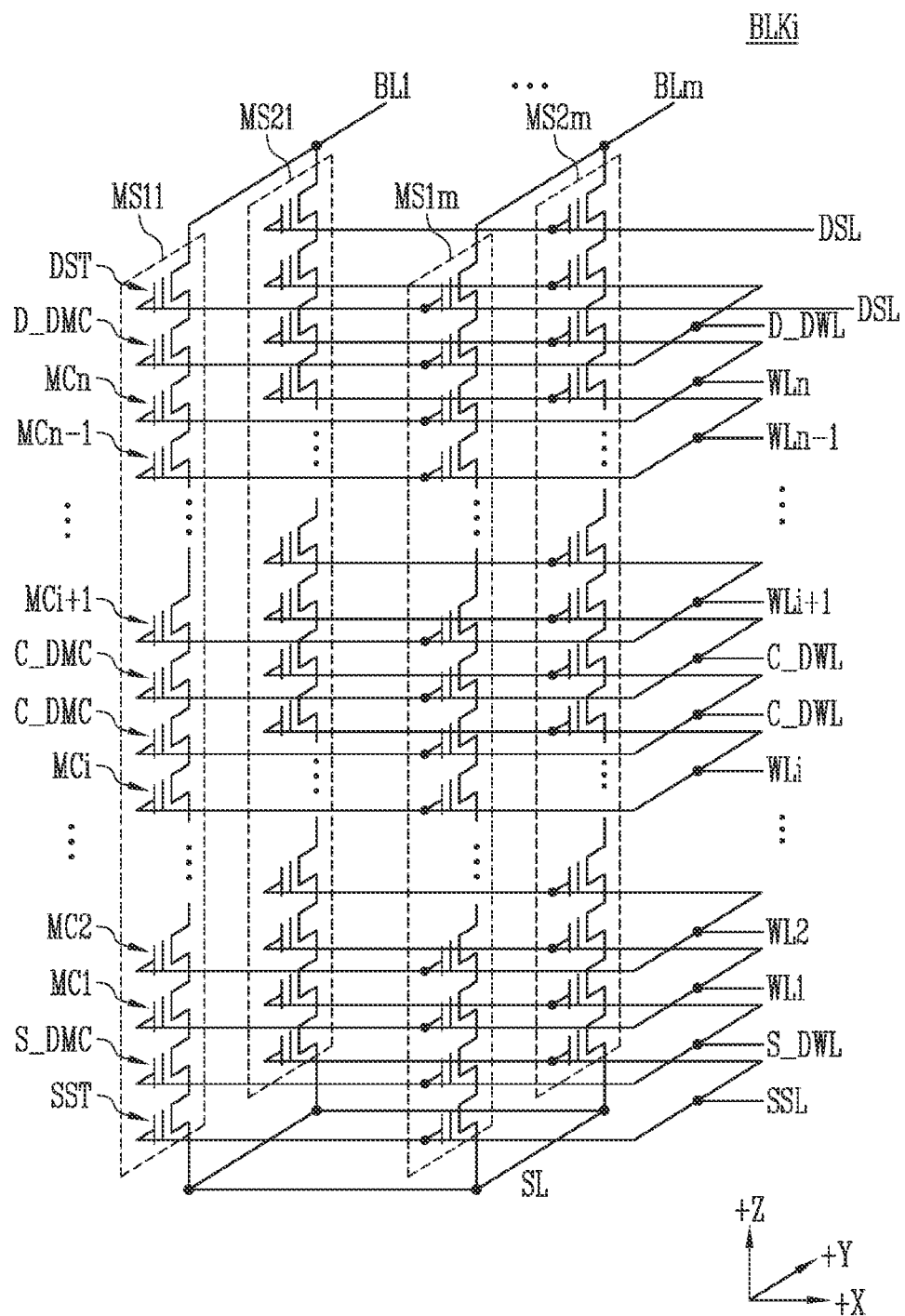
FIG. 3 is a diagram illustrating a structure of any one memory block among a plurality of memory blocks BLK1 to BLKz of FIG. 2.

FIG. 3 is a diagram illustrating a structure of any one memory block among the plurality of memory blocks BLK1 to BLKz of FIG. 2.

Referring to FIG. 3, a memory block BLKi may include a plurality of memory cell strings MS11 to MS1$m$ and MS21 to MS2$m$. The plurality of memory cell strings MS11 to MS1$m$ and MS21 to MS2$m$ may be connected between the bit lines BL1 to BLm and the source line SL. The plurality of memory cell strings MS11 to MS1$m$ and MS21 to MS2$m$ may be commonly connected to the source line SL. Each of the plurality of memory cell strings MS11 to MS1m and MS21 to MS2m may include at least one drain select transistor DST, a plurality of memory cells MC1 to MCn, and at least one source select transistor SST. The drain select transistor DST may be connected to the drain select line DSL in series, and the source select transistor SST may be connected to the source select line SSL in series. Each of the plurality of memory cells MC1 to MCn may be connected to a plurality of word lines WL1 to WLn, respectively. Memory cells of the same row (+X direction) among the plurality of memory cells MC1 to MCn may be connected to one word line. The plurality of memory cells MC1 to MCn may be memory cells stacked in a +Z direction.

Each of the plurality of memory cell strings MS11 to MS1m and MS21 to MS2m may include a first dummy memory cell D_DMC connected between the drain select transistor DST and an n-th memory cell MCn. The first dummy memory cell D_DMC may be connected to a first dummy word line D_DWL. Each of the plurality of memory cell strings MS11 to MS1m and MS21 to MS2m may include second dummy memory cells C_DMC connected between an (i+1)-th memory cell MCi+1 and an i-th memory cell MCi. The second dummy memory cells C_DMC may be connected to second dummy word lines C_DWL, respectively. Each of the plurality of memory cell strings MS11 to MS1m and MS21 to MS2m may include a third dummy memory cell S_DMC connected between the source select transistor SST and a first memory cell MC1. The third dummy memory cell S_DMC may be connected to a third dummy word line S_DWL.

Figure 4:
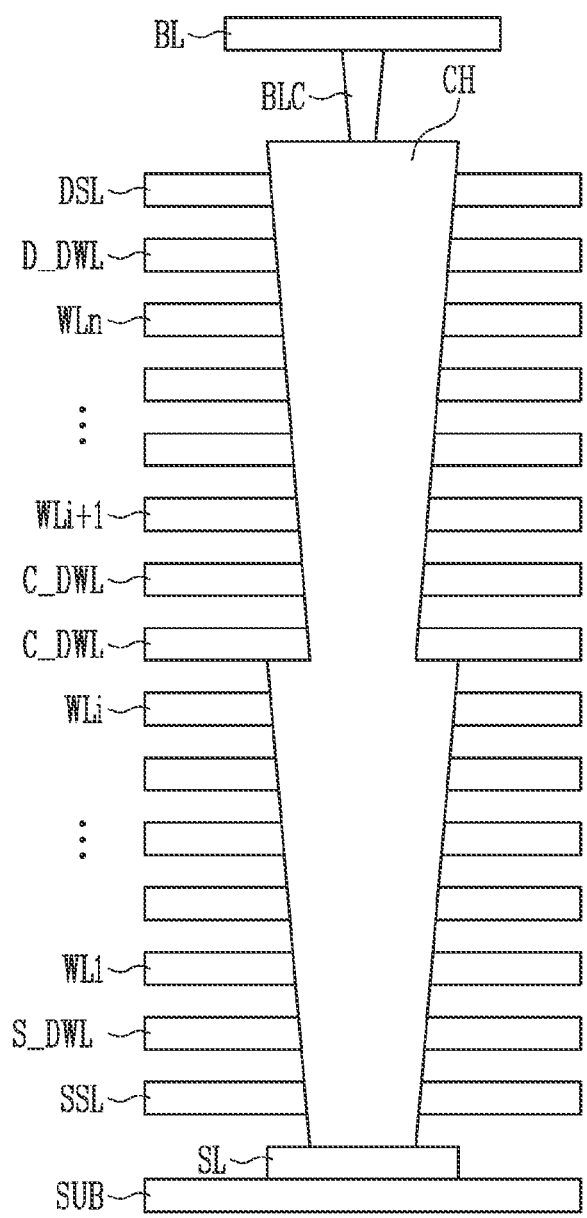
FIG. 4 is a diagram illustrating an example of a structure of a memory cell string shown in FIG. 3.

FIG. 4 is a diagram illustrating an example of a structure of the memory cell string shown in FIG. 3.

Referring to FIG. 4, the memory cell string MS may include a channel CH passing through the drain select line DSL, the dummy word lines D_DWL, C_DWL, and S_DWL, the plurality of word lines WL1 to WLn, and the source select line SSL.

The memory cell string MS may have a structure in which two or more plugs are stacked. In an embodiment, a channel passing through from the drain select line DSL to the second dummy word line C_DWL may be an upper plug, and a channel passing through from an i-th word line WLi to the source select line SSL may be a lower plug.

The channel CH may be connected between the source line SL and the bit line BL. The source line SL may be in contact with a bottom surface of the channel CH. The source line SL may be in contact with a substrate SUB. The bit line BL may be electrically connected to the channel CH through a bit line contact plug BLC.

The plurality of memory cells and dummy memory cells may be positioned at a portion where the plurality of word lines WL1 to WLn and the dummy word lines D_DWL, C_DWL, and S_DWL, and the channel CH intersect. The plurality of memory cells and dummy memory cells respectively connected to the plurality of word lines WL1 to WLn and the dummy word lines D_DWL, C_DWL, and S_DWL may be vertically stacked on the substrate SUB.

The channel CH may have different widths from an upper portion to a lower portion. Specifically, a width of the channel CH may become narrower from an n-th word line WLn to an (i+1)-th word line WLi+1, and the width of the channel CH may become narrower from an i-th word line WLi to a first word line WL1.

In the upper plug, the width of the channel CH may be the widest at the drain select line DSL side and the narrowest at the second dummy word line C_DWL side. In the lower plug, the width of the channel CH may be the widest at the i-th word line WLi side and the narrowest at the source select line SSL side.

Figure 5:
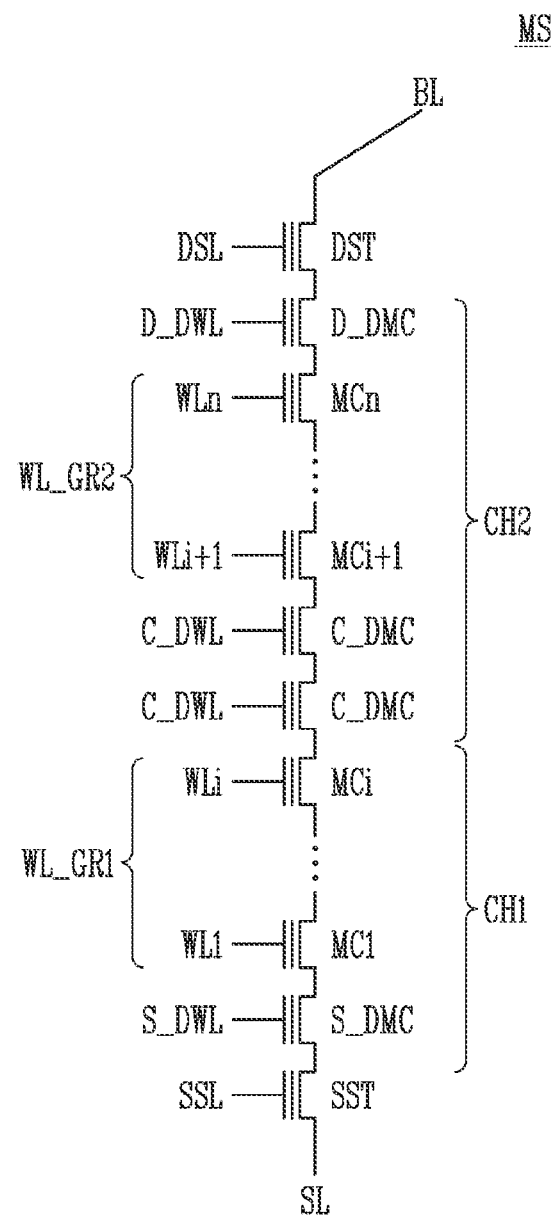
FIG. 5 is a diagram illustrating an example of any one memory cell string shown in FIG. 3.

FIG. 5 is a diagram illustrating an example of any one memory cell string shown in FIG. 3.

The memory cell string MS shown in FIG. 5 may be any one memory cell string among the plurality of memory cell strings MS11 to MS1m and MS21 to MS2m shown in FIG. 3.

Referring to FIG. 5, the memory cell string MS may be connected between the bit line BL and the source line SL. The memory cell string MS may include the drain select transistor DST, the dummy memory cells D_DMC, C_DMC, and S_DMC, the plurality of memory cells MC1 to MCn, and the source select transistor SST. The drain select transistor DST, the dummy memory cells D_DMC, C_DMC, and S_DMC, the plurality of memory cells MC1 to MCn, and the source select transistor SST may be connected in series by the channel CH shown in FIG. 4, and may be stacked vertically on the substrate.

The second dummy memory cells C_DMC may be connected between first to i-th memory cells MC1 to MCi and (i+1)-th to n-th memory cells MCi+1 to MCn. The second dummy memory cells C_DMC may be connected to the second dummy word lines C_DWL.

The first to i-th memory cells MC1 to MCi may be connected between the second dummy memory cells C_DMC and a third dummy memory cell S_DMC. The (i+1)-th to n-th memory cells MCi+1 to MCn may be connected between the first dummy memory cell D_DMC and the second dummy memory cells C_DMC.

The plurality of word lines may include a first word line group WL_GR1 and a second word line group WL_GR2. The second word line group WL_GR2 may be a word line group positioned on the first word line group WL_GR1.

The first word line group WL_GR1 may include first to i-th word lines WL1 to WLi connected to the first to i-th memory cells MC1 to MCi, respectively. The second word line group WL_GR2 may include (i+1)-th to n-th word lines WLi+1 to WLn connected to the (i+1)-th to n-th memory cells MCi+1 to MCn, respectively.

The channel CH shown in FIG. 4 may include a first channel area CH1 and a second channel area CH2. The second channel area CH2 may be a channel area positioned on the first channel area CH1. The first channel area CH1 may correspond to the lower plug, and the second channel area CH2 may correspond to the upper plug.

Figure 6:
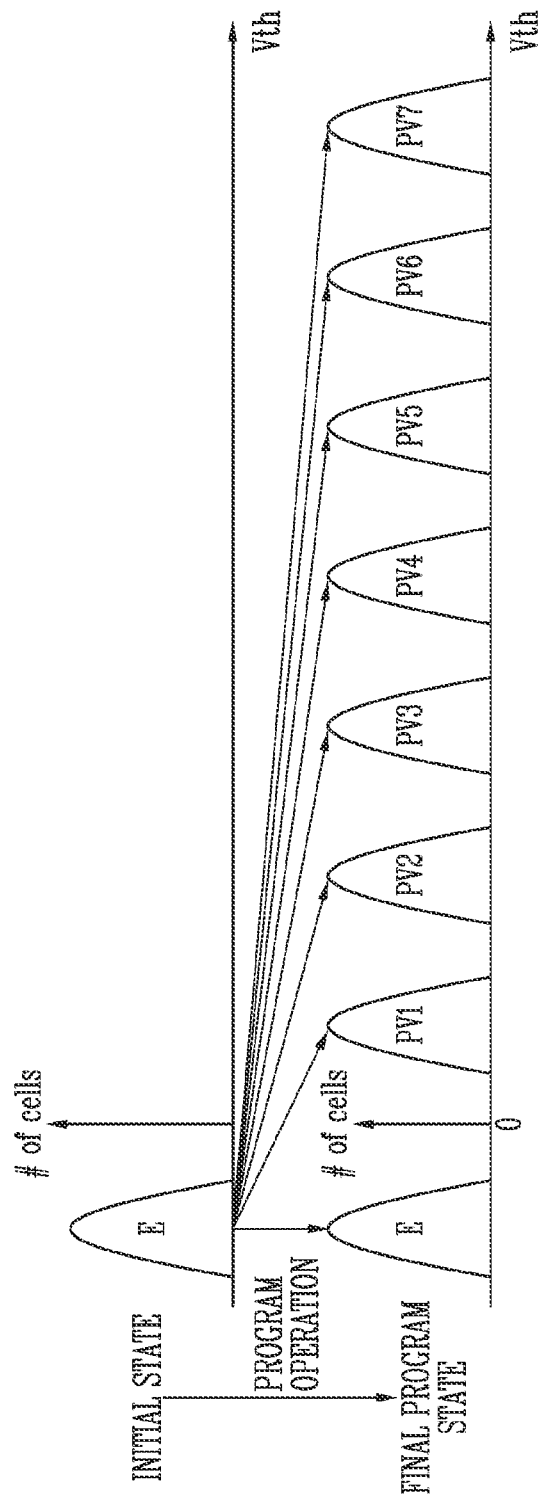
FIG. 6 is a diagram illustrating an example of a threshold voltage distribution of memory cells according to a program operation of the memory device.

FIG. 6 is a diagram illustrating an example of a threshold voltage distribution of the memory cells according to the program operation of the memory device.

In FIG. 6, a horizontal axis of a graph indicates a threshold voltage Vth of the memory cells, and a vertical axis of the graph indicates the number of memory cells (# of cells).

Referring to FIG. 6, the threshold voltage distribution of the memory cells may change from an initial state to a final program state according to the program operation.

In FIG. 6, it is assumed that one memory cell is programmed in the TLC that stores three bits of data.

The initial state is a state in which the program operation is not performed, and the threshold voltage distribution of the memory cells may be an erase state E.

The final program state may be a threshold voltage distribution of the memory cells on which the program operation is performed. A threshold voltage of the memory cells on which the program operation is performed may have a threshold voltage corresponding to any one state among a plurality of program states. For example, when one memory cell is programmed in the TLC that stores three bits of data, the plurality of program states may mean the erase state E and first to seventh program states PV1 to PV7. In an embodiment, the threshold voltage of the memory cells on which the program operation is performed may have a threshold voltage corresponding to any one state among the erase state E and the first to seventh program states PV1 to PV7. The threshold voltage of the memory cells in the initial state may increase to the threshold voltage corresponding to any one state among the erase state E and the first to seventh program states PV1 to PV7 through the program operation.

Each of the memory cells may have any one state among the erase state E and the first to seventh program states PV1 to PV7 as the target program state. The target program state may be determined according to data to be stored in the memory cell. Each of the memory cells may have a threshold voltage corresponding to a target program state among final program states through the program operation.

Figure 7:
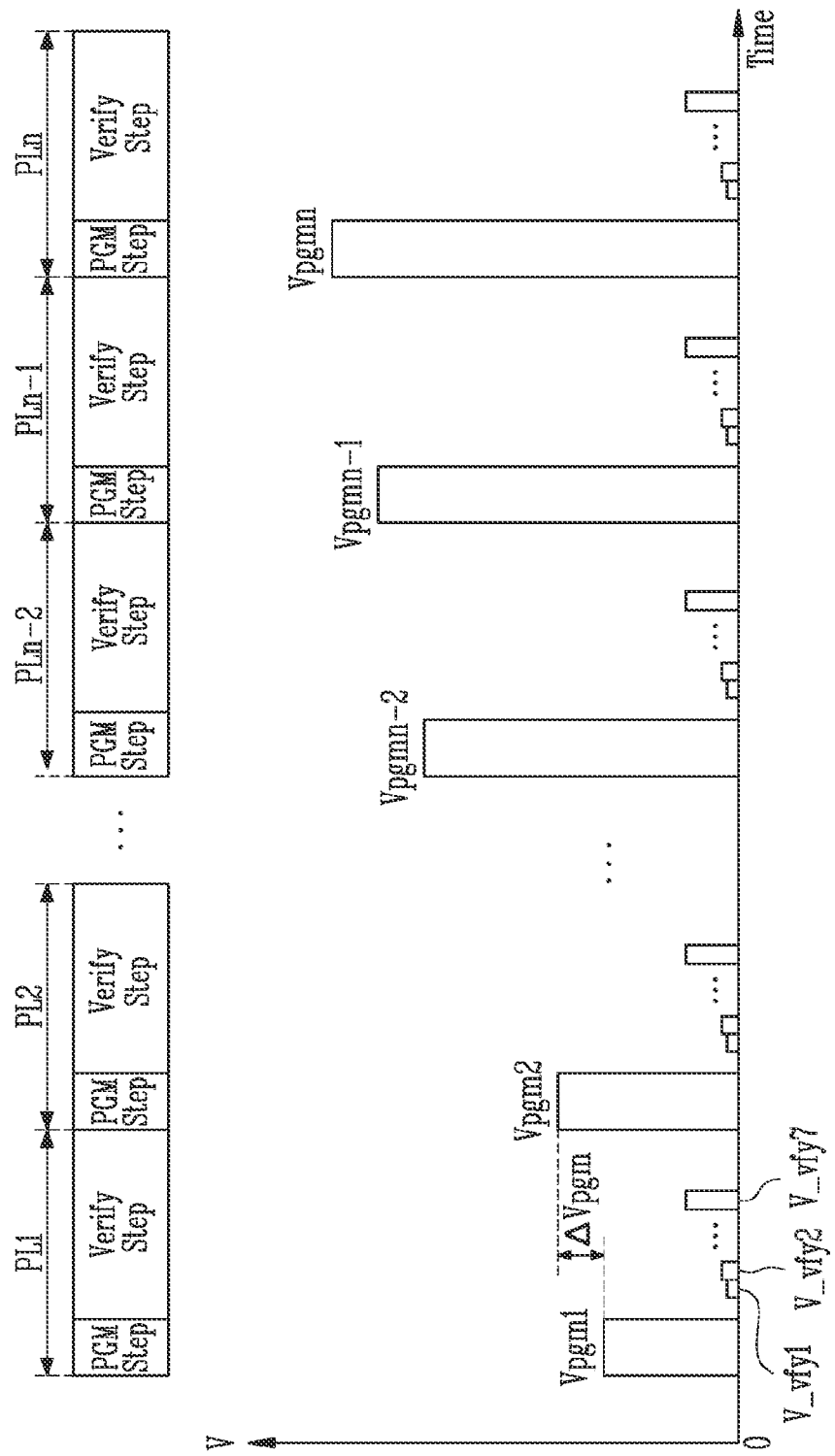
FIG. 7 is a diagram illustrating an example of the program operation of the memory device.

FIG. 7 is a diagram illustrating an example of the program operation of the memory device.

In FIG. 7, a horizontal axis of a graph indicates a time, and a vertical axis of the graph indicates a voltage V applied to a word line. The voltage V applied to the word line may include a program voltage Vpgm and a verify voltage V_vfy.

In FIG. 7, it is assumed that one memory cell is programmed in the TLC that stores three bits of data. However, the scope of the present disclosure is not limited thereto, and one memory cell may be programmed to store two or less bits of data or four or more bits of data.

Referring to FIG. 7, the program operation of the memory device 100 may include a plurality of program loops PL1 to PLn. The memory device 100 may perform the plurality of program loops PL1 to PLn to perform a program operation so that selected memory cells connected to the selected word line have a threshold voltage corresponding to any one state among the plurality of program states. For example, when one memory cell is programmed in the TLC, the memory device 100 may perform the plurality of program loops PL1 to PLn to perform the program operation so that the one memory cell has the threshold voltage corresponding to any one state among the erase state E and the first to seventh program states PV1 to PV7.

Each of the plurality of program loops PL1 to PLn may include a program voltage apply operation PGM Step and a verify operation Verify Step.

The program voltage apply operation PGM Step may be an operation of applying the program voltage to the selected word line to which the selected memory cells are connected. For example, the memory device 100 may apply a first program voltage Vpgm1 to the selected word line to which the selected memory cells are connected in a first program loop PL1. After the first program voltage Vpgm1 is applied to the selected word line, a threshold voltage of each of the selected memory cells may have the threshold voltage corresponding to the target program state among the plurality of program states.

The verify operation Verify Step may be an operation of applying the verify voltage to the selected word line to which the selected memory cells are connected. The verify operation Verify Step may be an operation of determining whether the threshold voltage of each of the selected memory cells has the threshold voltage corresponding to the target program state among the plurality of program states. The verify operation Verify Step may be an operation of applying the verify voltage corresponding to the target program state of each of the selected memory cells.

In an embodiment, in the first program loop PL1, the memory device 100 may apply the first program voltage Vpgm1 to the selected word line to which the selected memory cells are connected, and then apply first to seventh verify voltages V_vfy1 to V_vfy7. The memory device 100 may apply the verify voltage corresponding to the target program state of the memory cells among the first to seventh verify voltages V_vfy1 to V_vfy7 to the selected word line. For example, the memory device 100 may perform the verify operation Verify Step on the memory cells of which the target program state is a first program state by using the first verify voltage V_vfy1. A magnitude of the verify voltages V_vfy1 to V_vfy7 may increase from the first verify voltage V_vfy1 to the seventh verify voltage V_vfy7. Specifically, regarding the magnitude of the verify voltages V_vfy1 to V_vfy7, the first verify voltage V_vfy1 is the smallest and the seventh verify voltage V_vfy7 is the largest. The number of verify voltages is not limited to the present embodiment.

A threshold voltage of memory cells of which the verify operation Verify Step is passed by each of the verify voltages V_vfy1 to V_vfy7 may be determined to have the threshold voltage corresponding to the target program state. The memory cells of which the verify operation Verify Step is passed may be program inhibited in the second program loop PL2. A program inhibit voltage may be applied to the bit line connected to the program inhibited memory cells.

A threshold voltage of memory cells of which the verify operation Verify Step is failed by each of the verify voltages V_vfy1 to V_vfy7 may be determined not to have the threshold voltage corresponding to the target program state. The memory cells of which the verify operation Verify Step is failed may perform the second program loop PL2.

In the second program loop PL2, the memory device 100 may apply a second program voltage Vpgm2 higher than the first program voltage Vpgm1 by a unit voltage ΔVpgm to the selected word line to which the selected memory cells are connected. Thereafter, the memory device 100 may perform the verify operation Verify Step of the second program loop PL2 identically to the verify operation Verify Step of the first program loop PL1.

Thereafter, the memory device 100 may perform a next program loop identically to the second program loop PL2 by a preset number of times. The word "preset" as used herein with respect to a parameter, such as a preset number, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In an embodiment, when the program operation is not completed within a preset number of program loops, the program operation may a fail. When the program operation is completed within the preset number of program loops, the program operation may be a pass. Whether the program operation is completed may be determined by whether all verify operations Verify Step on the selected memory cells are passed. When the verify operations Verify Step on all selected memory cells is passed, the next program loop might not be performed.

In an embodiment, the program voltage may be determined according to an incremental step pulse programming (ISPP) method. A level of the program voltage may be increased or decreased in stages as the program loops PL1 to PLn are repeated. The number of times the program voltages used in each program loop are applied, a voltage level of the program voltages, a voltage apply time of the program voltages, and the like may be determined in various forms according to the control of the memory controller 200.

Figure 8:
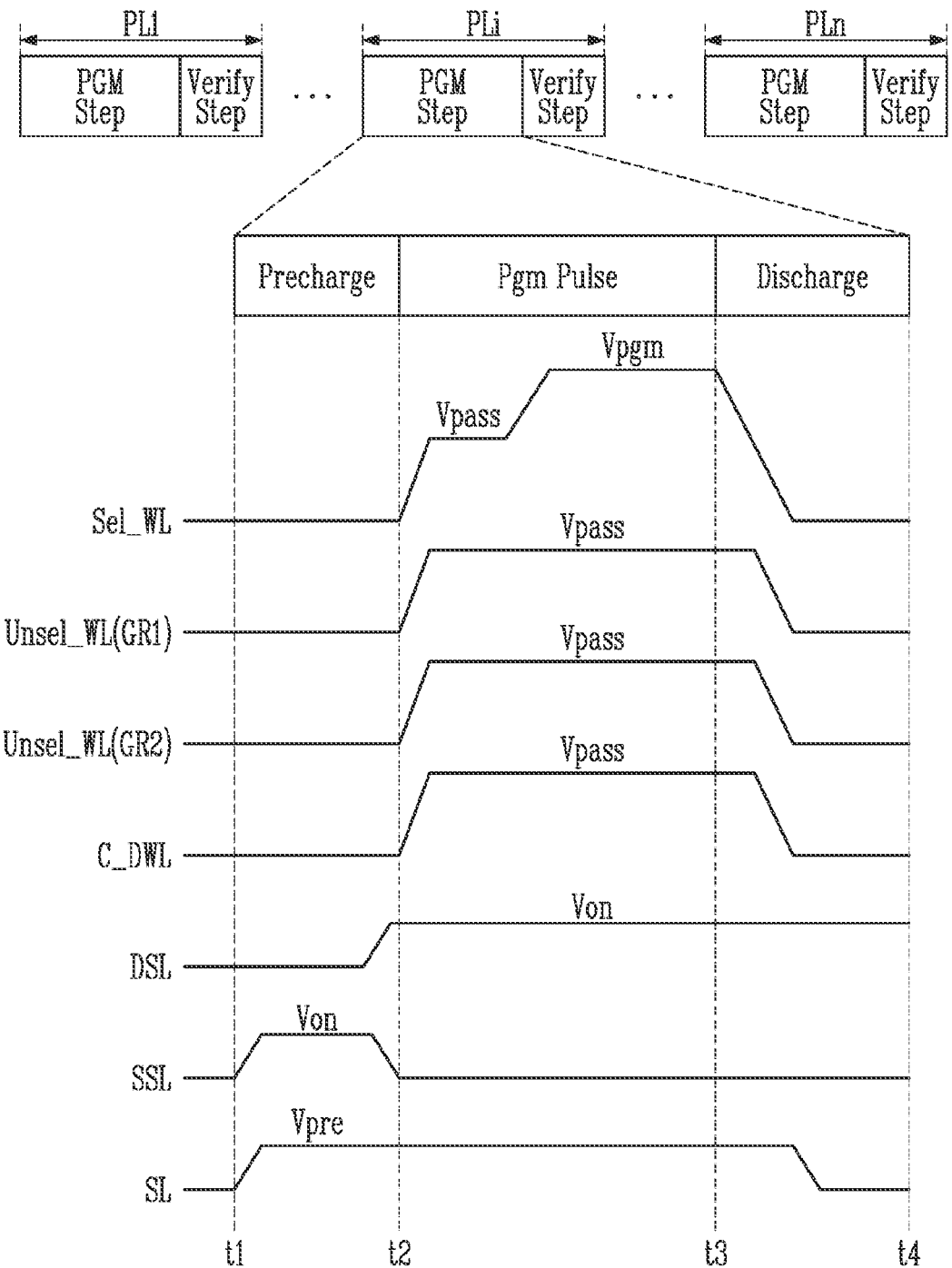
FIG. 8 is a diagram illustrating an example of a program voltage apply operation of the memory device.

FIG. 8 is a diagram illustrating an example of the program voltage apply operation of the memory device.

Referring to FIG. 8, the program operation may include a plurality of program loops PL1 to PLn. Each of the plurality of program loops PL1 to PLn may include a program voltage apply operation PGM Step and a verify operation Verify Step. The program voltage apply operation PGM Step may include a precharge period Precharge, a program pulse period Pgm Pulse, and a discharge period Discharge.

A period t1 to t2 may be a precharge period Precharge. The precharge period Precharge may be a period in which the channel area of the memory cells is precharged. In the period t1 to t2, the memory device 100 may apply a precharge voltage Vpre to the source line SL. The precharge voltage Vpre may be a voltage greater than a ground voltage. In an embodiment, the precharge voltage Vpre may be a power voltage. In the period t1 to t2, the memory device 100 may apply a turn-on voltage Von to the source select line SSL and then apply the ground voltage. The turn-on voltage Von may be a voltage greater than a threshold voltage of the source select transistor connected to the source select line SSL.

A period t2 to t3 may be the program pulse period Pgm pulse. The program pulse period Pgm pulse may be a period in which the threshold voltage of the selected memory cells connected to the selected word line is increased. In the period t2 to t3, the memory device 100 may apply the pass voltage Vpass to the selected word line Sel_WL and then apply the program voltage Vpgm. The memory device 100 may apply the turn-on voltage Von to the drain select line DSL before applying the pass voltage Vpass to the selected word line Sel_WL.

In the period t2 to t3, the memory device 100 may apply the pass voltage Vpass to the unselected word lines. The unselected word lines may include unselected word lines Unsel_WL(GR1) Included in the first word line group WL_GR1 and unselected word lines Unsel_WL(GR2) included in the second word line group WL_GR2. In the period t2 to t3, the memory device 100 may apply the pass voltage Vpass to the second dummy word line C_DWL. The second dummy word line C_DWL may be the second dummy word line C_DWL connected between the first word line group WL_GR1 and the second word line group WL_GR2 shown in FIG. 5.

A period t3 to t4 may be a discharge period Discharge. The discharge period Discharge may be a period in which a voltage applied to the plurality of word lines is discharged to the ground voltage. In the period t3 to t4, the memory device 100 may apply the ground voltage to the selected word line Sel_WL. In the period t3 to t4, the memory device 100 may apply the ground voltage to the unselected word lines, after applying the ground voltage to the selected word line Sel_WL. In the period t3 to t4, the memory device 100 may apply the ground voltage to the source line SL after applying the ground voltage to the unselected word lines.

Figure 9:
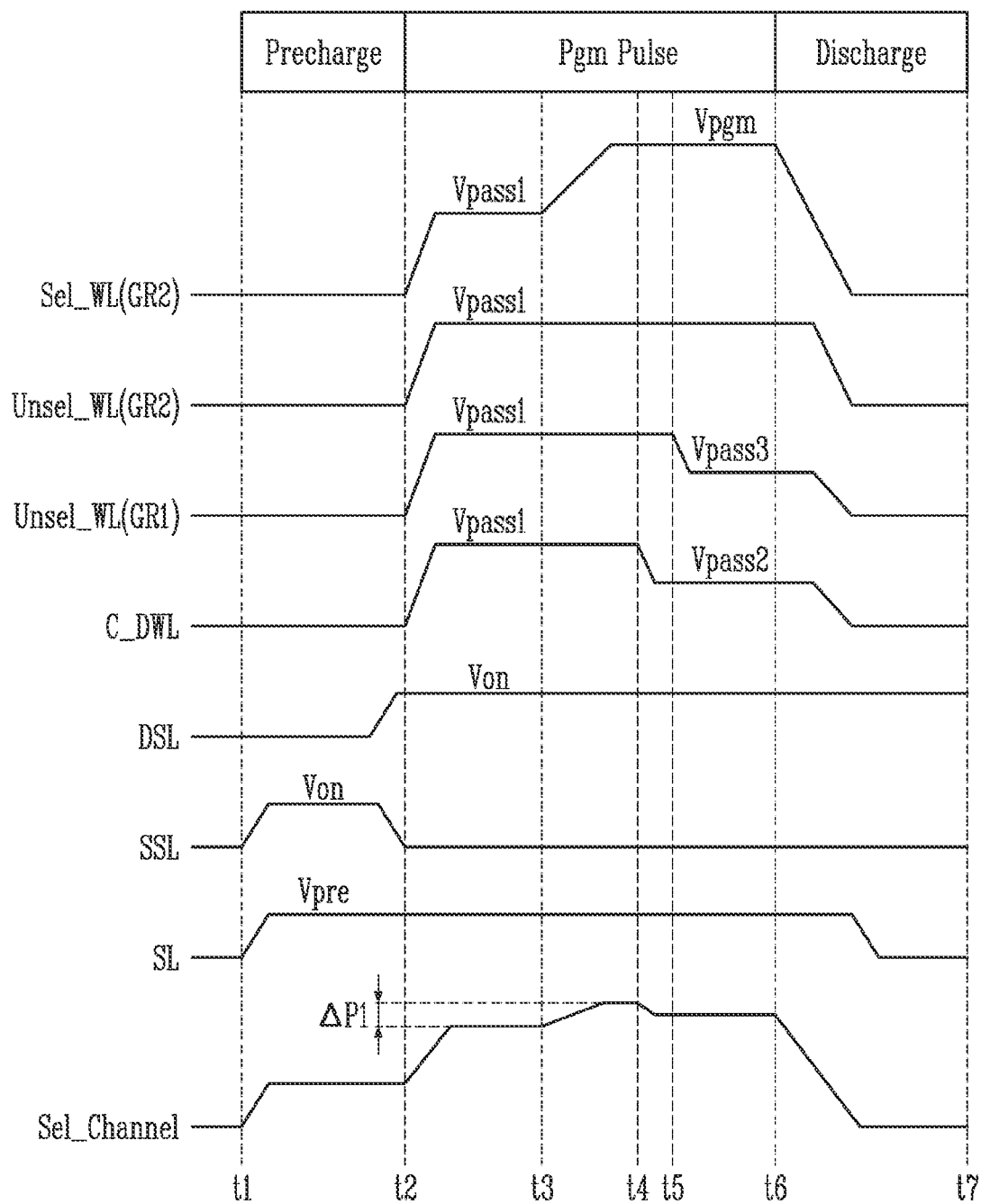
FIG. 9 is a diagram illustrating a program voltage apply operation of a memory device according to an embodiment of the present disclosure.

FIG. 9 is a diagram illustrating a program voltage apply operation of a memory device according to an embodiment of the present disclosure.

Regarding FIG. 9, a description of the precharge period and the discharge period overlapping those of FIG. 8 is omitted. Referring to FIG. 9, a case in which the selected word line is a word line included in the second word line group WL_GR2 is described as an example.

Referring to FIG. 9, a period t2 to t6 may be the program pulse period Pgm pulse. At a time point t2, the memory device 100 may apply a first pass voltage Vpass1 to a selected word line Sel_WL(GR2), unselected word lines Unsel_WL(GR1) and Unsel_WL(GR2), and the second dummy word line C_DWL.

At a time point t3, the memory device 100 may apply the program voltage Vpgm to the selected word line Sel_WL (GR2). At a time point t4, the memory device 100 may apply a second pass voltage Vpass2 to the second dummy word line C_DWL. A magnitude of the second pass voltage Vpass2 may be less than that of the first pass voltage Vpass1. At a time point t5, the memory device 100 may apply a third pass voltage Vpass3 to the first word line group Unsel_WL (GR1). A magnitude of the third pass voltage Vpass3 may be less than that of the first pass voltage Vpass1. The magnitude of the third pass voltage Vpass3 may be greater than that of the second pass voltage Vpass2. The memory device 100 may apply the second pass voltage Vpass2 to the second dummy word line C_DWL and then apply the third pass voltage Vpass3 to the first word line group Unsel_WL (GR1).

In a period t2 to t6, the memory device 100 may apply the first pass voltage Vpass1 to the unselected word lines Unsel_WL(GR2) included in the second word line group WL_GR2.

A channel potential Sel_Channel of the selected memory cells increasing when the program voltage Vpgm is applied to the selected word line Sel_WL(GR2) may be ΔP1.

In an embodiment, the memory device 100 may decrease a magnitude of the pass voltage applied to the word line group in which the selected word line is not included and the second dummy word line C_DWL while applying the program voltage to the selected word line. In an embodiment, the memory device 100 may improve a phenomenon in which the threshold voltage of the memory cells fluctuates during the program operation by decreasing the magnitude of the pass voltages applied to the word line group in which the selected word line is not included and the second dummy word line C_DWL.

In an embodiment, when the selected word line is included in the second word line group WL_GR2, the memory device 100 may decrease the magnitude of the pass voltage applied to the first word line group WL_GR1. When the selected word line is included in the first word line group WL_GR1, the memory device 100 may decrease the magnitude of the pass voltage applied to the second word line group WL_GR2.

Figure 10:
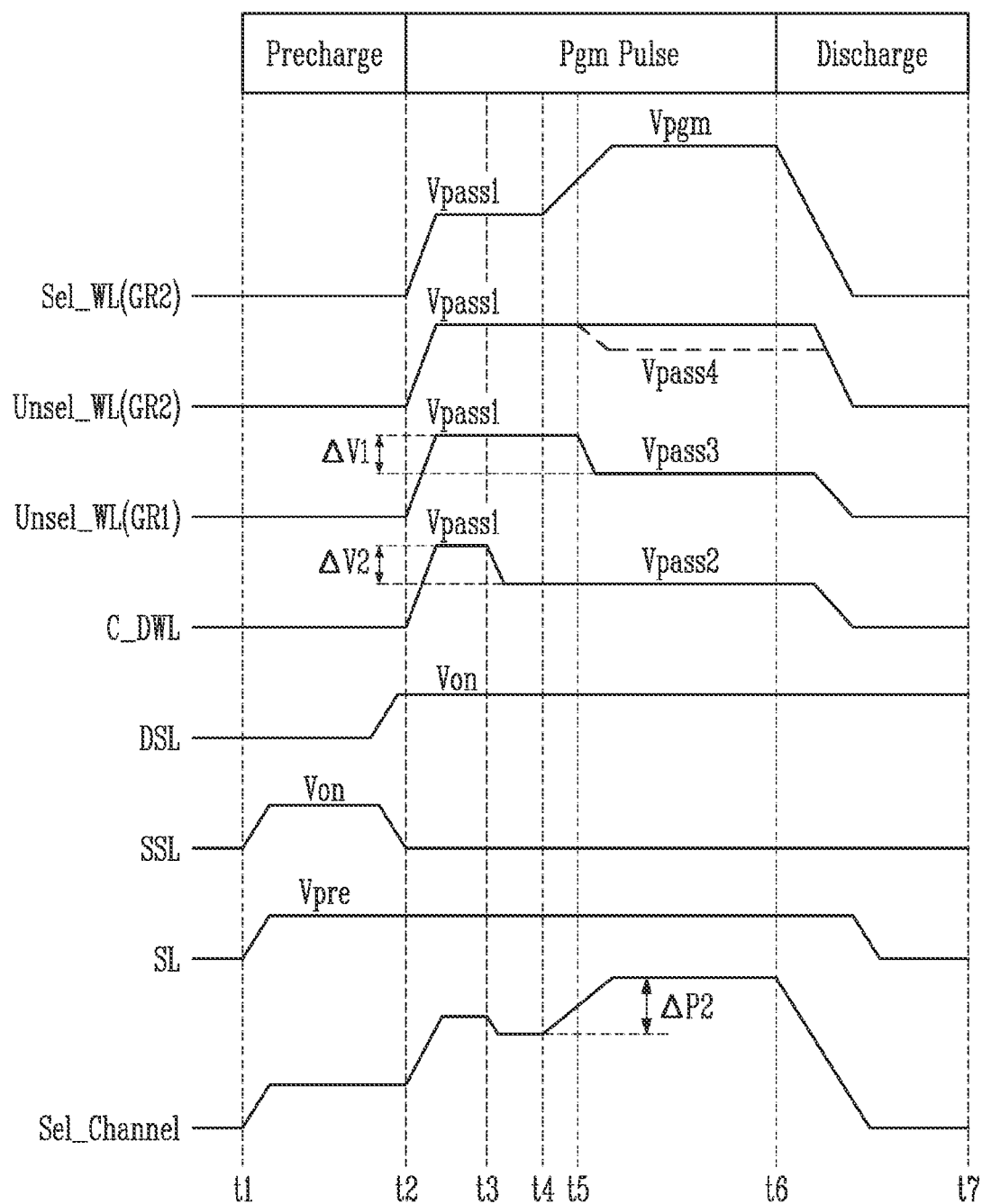
FIG. 10 is a diagram illustrating a program voltage apply operation of a memory device according to another embodiment of the present disclosure.

FIG. 10 is a diagram illustrating a program voltage apply operation of a memory device according to another embodiment of the present disclosure.

Regarding FIG. 10, a description of contents overlapping those of FIGS. 8 to 9 is omitted. Referring to FIG. 10, a case in which the selected word line is the word line included in the second word line group WL_GR2 is described as an example.

Referring to FIG. 10, the period t2 to t6 may be the program pulse period Pgm pulse. At the time point t2, the memory device 100 may apply the first pass voltage Vpass1 to the selected word line Sel_WL(GR2), the unselected word lines Unsel_WL(GR1) and Unsel_WL(GR2), and the second dummy word line C_DWL.

At the time point t3, the memory device 100 may apply the second pass voltage Vpass2 to the second dummy word line C_DWL. At the time point t4, the memory device 100 may apply the program voltage Vpgm to the selected word line Sel_WL(GR2). At the time point t5, the memory device 100 may apply the third pass voltage Vpass3 to the first word line group Unsel_WL(GR1).

In the period t2 to t6, the memory device 100 may apply the first pass voltage Vpass1 to the unselected word lines Unsel_WL(GR2) included in the second word line group WL_GR2. In an embodiment, at the time point t5, the memory device 100 may apply a fourth pass voltage Vpass4 less than the first pass voltage Vpass1 to a word line adjacent to the second dummy word line C_DWL among the unselected word lines Unsel_WL(GR2) included in the second word line group WL_GR2. For example, in FIG. 5, the word line adjacent to the second dummy word line among the unselected word lines Unsel_WL(GR2) included in the second word line group WL_GR2 may be the (i+1)-th word line.

The channel potential Sel_Channel of the selected memory cells increasing when the program voltage Vpgm is applied to the selected word line Sel_WL(GR2) may be ΔP2. The channel potential AP2 increased when the program voltage is applied to the selected word line in FIG. 10 may be greater than the channel potential AP1 increased when the program voltage is applied to the selected word line in FIG. 9.

In an embodiment, the memory device 100 may apply the first pass voltage Vpass1 to the second dummy word line C_DWL before applying the program voltage Vpgm to the selected word line, and apply the second pass voltage Vpass2. The memory device 100 decrease the magnitude of the pass voltage applied to the second dummy word line C_DWL before applying the program voltage Vpgm to the selected word line, to further increase a channel potential size of the selected memory cells increasing when the program voltage is applied to the selected word line.

In an embodiment, the memory device 100 may apply the program voltage Vpgm to the selected word line and then decrease the magnitude of the pass voltage applied to the word line group in which the selected word line is not included. Specifically, the memory device 100 may decrease the magnitude of the pass voltage applied to the word line group in which the selected word line is not included in a period in which a voltage magnitude of the selected word line increases from the first pass voltage Vpass1 to the program voltage Vpgm.

FIG. 11 is a diagram illustrating an example of the magnitude of the pass voltage changed according to a position of the selected word line.

In FIG. 11, a horizontal axis of a graph indicates the position of the selected word line Sel_WL, and a vertical axis of the graph indicates a magnitude difference ΔV1 between the first pass voltage Vpass1 and the third pass voltage Vpass3 or a magnitude difference ΔV2 between the first pass voltage Vpass1 and the second pass voltage Vpass2. FIG. 11 is described with reference to FIG. 10.

In FIG. 11, the n-th word line WLn may be a word line adjacent to the first dummy word line D_DWL as shown in FIG. 5. The (i+1)-th word line WLi+1 may be a word line adjacent to the second dummy word line C_DWL as shown in FIG. 5.

Referring to an upper end graph of FIG. 11, the magnitude difference ΔV1 between the first pass voltage Vpass1 and the third pass voltage Vpass3 applied to the word line group in which the selected word line is not included may be changed according to the position of the selected word line. The magnitude difference ΔV1 between the first pass voltage Vpass1 and the third pass voltage Vpass3 may be changed in stages.

Specifically, when the selected word line is included in the second word line group WL_GR2, as the selected word line is adjacent to the second dummy word line C_DWL, the magnitude difference ΔV1 between the first pass voltage Vpass1 and the third pass voltage Vpass3 applied to the first word line group WL_GR1 may decrease. For example, the memory device 100 may increase a magnitude of the third pass voltage Vpass3 applied to the first word line group WL_GR1 as the selected word line Sel_WL is adjacent to the second dummy word line C_DWL. As another example, the memory device 100 may decrease a magnitude of the first pass voltage Vpass1 applied to the first word line group WL_GR1 as the selected word line is adjacent to the second dummy word line C_DWL.

Referring to a lower end graph of FIG. 11, the magnitude difference ΔV2 between the first pass voltage Vpass1 and the second pass voltage Vpass2 applied to the second dummy word line C_DWL may be changed according to the position of the selected word line. The magnitude difference ΔV2 between the first pass voltage Vpass1 and the second pass voltage Vpass2 may be changed in stages.

Specifically, when the selected word line is included in the second word line group WL_GR2, as the selected word line is adjacent to the second dummy word line C_DWL, the magnitude difference Δ1 between the first pass voltage Vpass1 and the second pass voltage Vpass2 applied to the second dummy word line C_DWL may increase. For example, the memory device 100 may decrease a magnitude of the second pass voltage Vpass2 applied to the second dummy word line C_DWL as the selected word line Sel_WL is adjacent to the second dummy word line C_DWL. As another example, the memory device 100 may increase the magnitude of the first pass voltage Vpass1 applied to the second dummy word line C_DWL as the selected word line Sel_WL is adjacent to the second dummy word line C_DWL.

Figure 12:
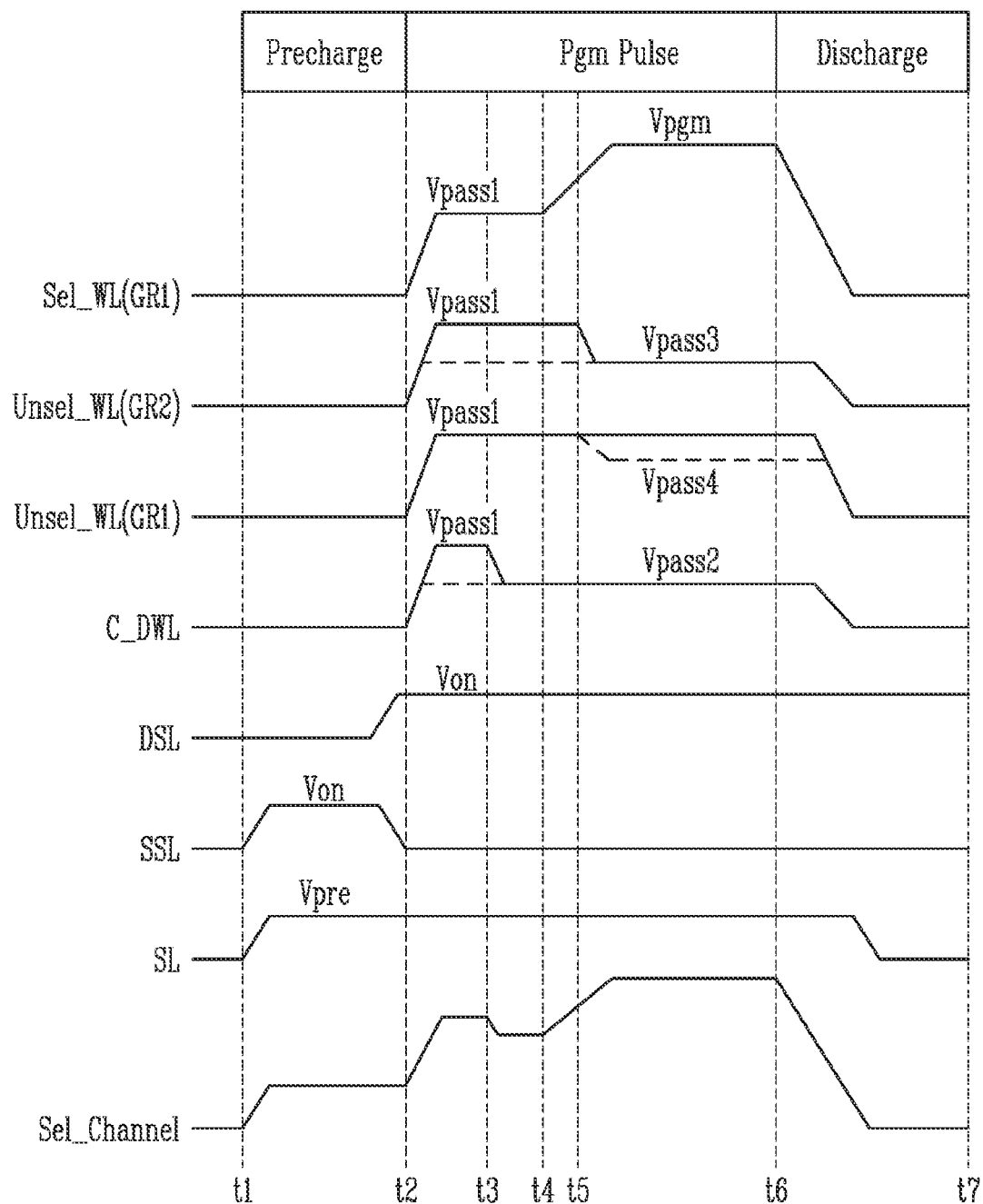
FIG. 12 is a diagram illustrating a program voltage apply operation of a memory device according to still another embodiment of the present disclosure.

FIG. 12 is a diagram illustrating a program voltage apply operation of a memory device according to still another embodiment of the present disclosure.

Referring to FIG. 12, a case in which the selected word line is a word line included in the first word line group WL_GR1 is described as an example.

Referring to FIG. 12, the period t2 to t6 may be the program pulse period Pgm pulse. At the time point t2, the memory device 100 may apply the first pass voltage Vpass1 to the selected word line Sel_WL(GR1), the unselected word lines Unsel_WL(GR1) and Unsel_WL(GR2), and the second dummy word line C_DWL.

At the time point t3, the memory device 100 may apply the second pass voltage Vpass2 to the second dummy word line C_DWL. At the time point t4, the memory device 100 may apply the program voltage Vpgm to the selected word line Sel_WL(GR1). At the time point t5, the memory device 100 may apply the third pass voltage Vpass3 to the second word line group Unsel_WL(GR2).

In the period t2 to t6, the memory device 100 may apply the first pass voltage Vpass1 to the unselected word lines Unsel_WL(GR1) included in the first word line group WL_GR1. In an embodiment, at the time point t5, the memory device 100 may apply the fourth pass voltage Vpass4 less than the first pass voltage Vpass1 to the word line adjacent to the second dummy word line C_DWL among the unselected word lines Unsel_WL(GR1) included in the first word line group WL_GR1. For example, in FIG. 5, the word line adjacent to the second dummy word line C_DWL among the unselected word lines Unsel_WL(GR2) included in the first word line group WL_GR1 may be the i-th word line.

In an embodiment, at the time point t2, the memory device 100 may apply the first pass voltage Vpass1 to the selected word line Sel_WL(GR1) and the unselected word lines Unsel_WL(GR1) included in the first word line group WL_GR1, apply the third pass voltage Vpass3 to the second word line group Unsel_WL(GR2), and apply the second pass voltage Vpass2 to the second dummy word line C_DWL. The magnitude of the second pass voltage Vpass2 may be less than that of the third pass voltage Vpass3.

FIG. 13 is a flowchart illustrating a program operation of a memory device according to an embodiment of the present disclosure.

Referring to FIG. 13, in step S1301, the memory device 100 may precharge the channel area of the memory cells. In an embodiment, the memory device 100 may apply the precharge voltage to the source line and apply the turn-on voltage to the source select line.

In step S1303, the memory device 100 may apply the first pass voltage to the selected word line, the unselected word line, and the dummy word line. The dummy word line may be a word line between the first word line group and the second word line group.

In step S1305, the memory device 100 may apply the second pass voltage less than the first pass voltage to the dummy word line.

In step S1307, the memory device 100 may apply the program voltage to the selected word line.

In step S1309, the memory device 100 may apply the third pass voltage less than the first pass voltage to the word line group in which the selected word line is not included. For example, when the selected word line is included in the second word line group, the memory device 100 may apply the third pass voltage to the first word line group. As another example, when the selected word line is included in the first word line group, the memory device 100 may apply the third pass voltage to the second word line group.

What is claimed is:

1. A memory device comprising:
  a memory cell string including first memory cells included in a first channel area formed vertically on a substrate, second memory cells included in a second channel area positioned on the first channel area, and dummy memory cells included in the second channel area and connected between the first memory cells and the second memory cells;
  a peripheral circuit configured to perform a program operation of storing data in the first and second memory cells; and
  a program operation controller configured to control the peripheral circuit to sequentially apply a first pass voltage and a second pass voltage less than the first pass voltage to a dummy word line connected to the dummy memory cells during the program operation, and then apply a program voltage to a selected word line among a plurality of word lines connected to the first and second memory cells.

2. The memory device of claim 1,
  wherein the plurality of word lines includes a first word line group connected to the first memory cells and a second word line group connected to the second memory cells, and
  wherein the program operation controller controls the peripheral circuit to apply the first pass voltage to unselected word lines included in the first word line group and the second word line group when the first pass voltage is applied to the dummy word line.

3. The memory device of claim 2, wherein the program operation controller controls the peripheral circuit to apply the first pass voltage to the unselected word lines, and apply a third pass voltage less than the first pass voltage to any one word line group in which the selected word line is not included among the first word line group and the second word line group.

4. The memory device of claim 3, wherein the program operation controller controls the peripheral circuit to apply a fourth pass voltage less than the first pass voltage to a word line adjacent to the dummy word line among unselected word lines included in another word line group in which the selected word line is included while applying the third pass voltage to the any one word line group.

5. The memory device of claim 3, wherein the program operation controller controls the peripheral circuit to apply the second pass voltage to the dummy word line before applying the third pass voltage to the any one word line group.

6. The memory device of claim 3, wherein the program operation controller controls the peripheral circuit to apply the program voltage to the selected word line before applying the third pass voltage to the any one word line group.

7. The memory device of claim 3, wherein the program operation controller controls the peripheral circuit to increase a magnitude of the third pass voltage applied to the any one word line group as a location of the selected word line gets closer to the dummy word line.

8. The memory device of claim 1, wherein the program operation controller controls the peripheral circuit to decrease a magnitude of the second pass voltage applied to the dummy word line as a location of the selected word line gets closer to the dummy word line.

9. The memory device of claim 1, wherein the plurality of word lines includes a first word line group connected to the first memory cells and a second word line group connected to the second memory cells, and
  the program operation controller controls the peripheral circuit to apply a third pass voltage less than the first pass voltage to any one word line group in which the selected word line is not included among the first word line group and the second word line group when applying the first pass voltage to the dummy word line, and apply the first pass voltage to another word line group in which the selected word line is included among the first word line group and the second word line group.

10. The memory device of claim 1, wherein the program operation controller controls the peripheral circuit to apply the first pass voltage to the selected word line when applying the first pass voltage to the dummy word line.

11. A method of operating a memory device comprising first memory cells included in a first channel area formed vertically on a substrate, second memory cells included in a second channel area positioned on the first channel area, and dummy memory cells included in the second channel area and connected between the first memory cells and the second memory cells, the method comprising:
  sequentially applying a first pass voltage and a second pass voltage less than the first pass voltage to a dummy word line connected to the dummy memory cells; and
  applying a program voltage to a selected word line among a plurality of word lines connected to the first and second memory cells.

12. The method of claim 11, wherein the plurality of word lines includes a first word line group connected to the first memory cells and a second word line group connected to the second memory cells, and wherein the first pass voltage is applied to unselected word lines included in the first word line group and the second word line group when the first pass voltage is applied to the dummy word line.

13. The method of claim 12, wherein when the selected word line is included in the first word line group, the first pass voltage is applied to the unselected word lines included in the first word line group and the second word line group, and a third pass voltage less than the first pass voltage is applied to the second word line group.

14. The method of claim 12, wherein when the selected word line is included in the second word line group, the first pass voltage is applied to the unselected word lines included in the first word line group and the second word line group, and a third pass voltage less than the first pass voltage is applied to the first word line group.

15. The method of claim 13, wherein a fourth pass voltage less than the first pass voltage is applied to a word line adjacent to the dummy word line among unselected word lines included in the first word line group while the third pass voltage is applied to the second word line group.

16. The method of claim 13, wherein the second pass voltage is applied to the dummy word line before the third pass voltage is applied to the second word line group.

17. The method of claim 13, wherein the program voltage is applied to the selected word line before the third pass voltage is applied to the second word line group.

18. The method of claim 13, wherein a magnitude of the third pass voltage applied to the second word line group increases as the selected word line is located closer to the dummy word line.

19. The method of claim 11, wherein a magnitude of the second pass voltage applied to the dummy word line decreases as the selected word line is located closer to the dummy word line.

20. The method of claim 11, wherein the plurality of word lines include a first word line group connected to the first memory cells and a second word line group connected to the second memory cells, and when the first pass voltage is applied to the dummy word line, a third pass voltage less than the first pass voltage is applied to any one word line group in which the selected word line is not included among the first word line group and the second word line group, and the first pass voltage is applied to another word line group in which the selected word line is included among the first word line group and the second word line group.

* * * * *